US011852800B2

(12) United States Patent
Becker et al.

(10) Patent No.: US 11,852,800 B2
(45) Date of Patent: *Dec. 26, 2023

(54) BACKSIDE ETCH PROCESS FOR TRANSPARENT SILICON OXIDE TECHNOLOGY

(71) Applicant: L3Harris Technologies, Inc., Melbourne, FL (US)

(72) Inventors: Jacob Becker, Gilbert, AZ (US); Jon Burnsed, Tempe, AZ (US)

(73) Assignee: L3HARRIS TECHNOLOGIES, INC., Melbourne, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 17/987,157

(22) Filed: Nov. 15, 2022

(65) Prior Publication Data
US 2023/0085741 A1 Mar. 23, 2023

Related U.S. Application Data

(63) Continuation of application No. 16/868,306, filed on May 6, 2020, now Pat. No. 11,550,140.

(51) Int. Cl.
G02B 23/12 (2006.01)
G02B 27/01 (2006.01)
(Continued)

(52) U.S. Cl.
CPC ....... *G02B 23/125* (2013.01); *G02B 27/0172* (2013.01); *H10K 59/32* (2023.02);
(Continued)

(58) Field of Classification Search
CPC .............. G02B 23/125; G02B 27/0172; G02B 2027/0132; G02B 2027/0118;
(Continued)

(56) References Cited

U.S. PATENT DOCUMENTS 6,624,414 B1 9/2003 Glesener
8,304,728 B2 11/2012 So
(Continued)

FOREIGN PATENT DOCUMENTS

| CN | 110649083 A | 1/2020 |
| CN | 112310808 A | 2/2021 |
| EP | 3155668 B1 | 2/2021 |

OTHER PUBLICATIONS

Non-Final Office Action received for U.S. Appl. No. 16/868,306, dated Jun. 7, 2022, 9 pages.
(Continued)

*Primary Examiner* — Muhammad N Edun
(74) *Attorney, Agent, or Firm* — Workman Nydegger

(57) ABSTRACT

Increasing transparency of one or more micro-displays. A method includes attaching a transparent cover to at least a portion of a semiconductor wafer. The at least a portion of the semiconductor wafer includes the one or more micro-displays. The one or more micro-displays include one or more active silicon areas. The method further includes, after the transparent cover has been attached to the at least a portion of the semiconductor wafer, removing silicon between one or more of the active silicon areas, causing the one or more micro-displays to have a transparency of at least 50%.

20 Claims, 20 Drawing Sheets

(51) Int. Cl.
  *H10K 59/32* (2023.01)
  *H10K 71/00* (2023.01)
  *H10K 71/20* (2023.01)
  *H10K 102/00* (2023.01)

(52) U.S. Cl.
  CPC ........... *H10K 71/00* (2023.02); *H10K 71/231* (2023.02); *G02B 2027/0132* (2013.01); *H10K 2102/00* (2023.02)

(58) Field of Classification Search
  CPC . H01L 51/56; H01L 51/0096; H01L 51/5237; H01L 2227/323; H01L 51/0017; H01L 27/3209; H01L 2251/303; H01L 27/127; H01L 27/1262; H01L 27/32; H01L 2251/105; H01J 31/50
  See application file for complete search history.

(56) References Cited

U.S. PATENT DOCUMENTS

| | | |
|---|---|---|
| 10,763,092 B2 | 9/2020 | Burnsed et al. |
| 11,550,140 B2 | 1/2023 | Becker et al. |
| 2006/0237810 A1 | 10/2006 | Sand et al. |
| 2008/0049159 A1 | 2/2008 | Tsaur et al. |
| 2010/0084679 A1 | 4/2010 | Hsieh et al. |
| 2013/0129349 A1 | 5/2013 | Maxik et al. |
| 2013/0215496 A1 | 8/2013 | Ban et al. |
| 2015/0008390 A1 | 1/2015 | Lewis et al. |
| 2017/0094199 A1 | 3/2017 | Sarusi et al. |
| 2017/0280067 A1 | 9/2017 | Mingus et al. |
| 2018/0356625 A1 | 12/2018 | Conley |
| 2019/0363069 A1 | 11/2019 | Ahmed et al. |
| 2019/0393271 A1 | 12/2019 | So et al. |
| 2020/0200873 A1 | 6/2020 | Schmidt |
| 2020/0209708 A1 | 7/2020 | Neshev et al. |
| 2020/0400944 A1 | 12/2020 | Burnsed et al. |
| 2021/0349301 A1 | 11/2021 | Becker et al. |
| 2022/0057519 A1 | 2/2022 | Goldstein et al. |
| 2022/0268697 A1 | 8/2022 | Burnsed |

OTHER PUBLICATIONS

Notice of Allowance received for U.S. Appl. No. 16/868,306, dated Oct. 6, 2022, 3 pages.
Notice of Allowance received for U.S. Appl. No. 16/868,306, dated Sep. 23, 2022, 5 pages.
Tanslation of CN-112310808-A (Year: 2021).
Translation of CN-110649083-A (Year: 2020).
Search Report received for French Patent Application No. 2104393, dated Apr. 17, 2023, 6 pages.

BACKSIDE ETCH PROCESS FOR TRANSPARENT SILICON OXIDE TECHNOLOGY

CROSS-REFERENCE TO RELATED APPLICATIONS

This application is a continuation of U.S. patent application Ser. No. 16/868,306 filed on May 6, 2020, entitled "BACKSIDE ETCH PROCESS FOR TRANSPARENT SILICON OXIDE TECHNOLOGY," which application is expressly incorporated herein by reference in its entirety.

BACKGROUND

Background and Relevant Art

Night vision systems allow a user to see in low-light environments without external human visible illumination. This allows for covert vision in a low-light environment to prevent flooding the environment with human visible light and/or protects the user from being detected due to causing human visible light or light that is otherwise detectable to other night vision systems to be emitted.

Currently, there are two different general classes of night vision systems: analog and digital. Analog systems function by receiving low levels of light reflected off of or emitted from objects and providing that light to an image intensifier. The image intensifier has a photocathode. When photons strike the photocathode, electrons are emitted through a vacuum tube, and directed towards a microchannel plate to amplify the electrons. The amplified electrons strike a phosphor screen. The phosphor screen is typically chosen such that it emits human visible light when the amplified electrons strike the phosphor screen. The phosphor screen light emission is coupled, typically through an inverting fiber optic, to an eyepiece where the user can view the illuminated phosphor screen, thus allowing the user to see the objects.

Digital night vision systems function by directing light to a sensor pixel array to detect the light, such as CCD or CMOS, and then processing this information before outputting images to a display for the user to view the detected images. Often, digital nightvision systems require the use of external illumination using light outside of the human visible spectrum. This allows a user of a digital nightvision system to be easily detected by others using similar nightvision systems, which can readily detect the external illumination because they are all typically sensitive to the same wavelengths of light.

Analog nightvision systems are superior to digital nightvision systems in a number of aspects. For example, analog nightvision systems typically have higher limiting resolution imaging capability than digital nightvision systems. Additionally, analog nightvision systems consume ultra-low power as compared to digital nightvision systems. Additionally, as discussed previously, analog nightvision systems are often capable of being operated passively without external illumination, whereas most digital nightvision systems are often much more readily detectable by others using nightvision systems due to their lower overall sensitivity requiring the external illumination.

However, digital nightvision systems currently have at least one advantage over analog nightvision systems. That is, recently it has become desirable to overlay certain images and/or information on a nightvision image. In particular, it has become desirable to implement a so-called heads-up display in conjunction with the nightvision image. Such a display can convey information to the user such as temperatures, distances, indicators marking objects, situational awareness messages, messages from other users, etc. Implementing this functionality in digital nightvision systems is a simple task as the nightvision image signal can be simply multiplexed with the heads-up display signal and an image including the nightvision image and the heads-up display information is rendered as a single image and output to the users display. In contrast, implementing a heads-up display using analog nightvision technology is significantly more complex as the heads-up display information cannot be simply output to the image intensifier. This is due to the fact that generally the heads-up display information is produced in a digital format while the image intensifier operates in an exclusively analog fashion. Thus, the rendered images must be combined, rather than rendering a combined image. That is, the image intensifier image is combined with a digital heads-up display image using two different image sources combined in an optical fashion using waveguides, prisms, and other light deflecting technologies.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a method of increasing transparency of one or more micro-displays. The method includes attaching a transparent cover to at least a portion of a semiconductor wafer. The at least a portion of the semiconductor wafer includes the one or more micro-displays. The one or more micro-displays include one or more active silicon areas. The method further includes, after the transparent cover has been attached to the at least a portion of the semiconductor wafer, removing silicon between one or more of the active silicon areas, causing the one or more micro-displays to have a transparency of at least 50%.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

One embodiment illustrated herein uses a transparent micro-display, which in some embodiments may be an organic light emitting diode (OLED) display (which in the illustrated examples, is at least partially transparent), in conjunction with an image output from an image intensifier to implement heads-up display functionality in an analog nightvision system by causing the output from the image intensifier to be displayed through the micro-display. As used herein, a micro-display is one that is 2 inches or less in diagonal. However, one challenge that arises when using transparent micro-displays to project images through the transparent micro-displays relates to opacity of the micro-display. In particular, due to certain fabrication requirements, such a micro-display often includes areas of non-active silicon between active silicon areas of the micro-display. The active areas are the areas containing semiconductor devices intended to be powered, such as the transistors to drive the LEDs of the micro-display. Native silicon is more opaque than silicon dioxide. Thus, the micro-displays may be designed where oxide trenches (e.g., silicon dioxide trenches) are formed in the non-active silicon to provide a level of transparency between active areas of the micro-display. However, there is a limit to the size in which these oxide trenches may be formed. In particular, some foundries require that an oxide trench should be no larger than 1 micron thick. While other foundries may have different requirements, they generally require some minimum thickness of the oxide trench to allow sufficient native silicon structure to support the other structures on the wafer. That is, a foundry with typically not allow only oxide between active silicon areas on a wafer delivered from the foundry. Thus, the micro-display will have areas of native non-active silicon and areas of silicon dioxide in between active areas of the micro-display where the silicon areas reduce the amount of light that can be transmitted through the micro-display. Embodiments illustrated herein may address this by removing the non-active silicon between active areas to create a micro-display that is able to more efficiently transmit light through the micro-display.

Figure 1:
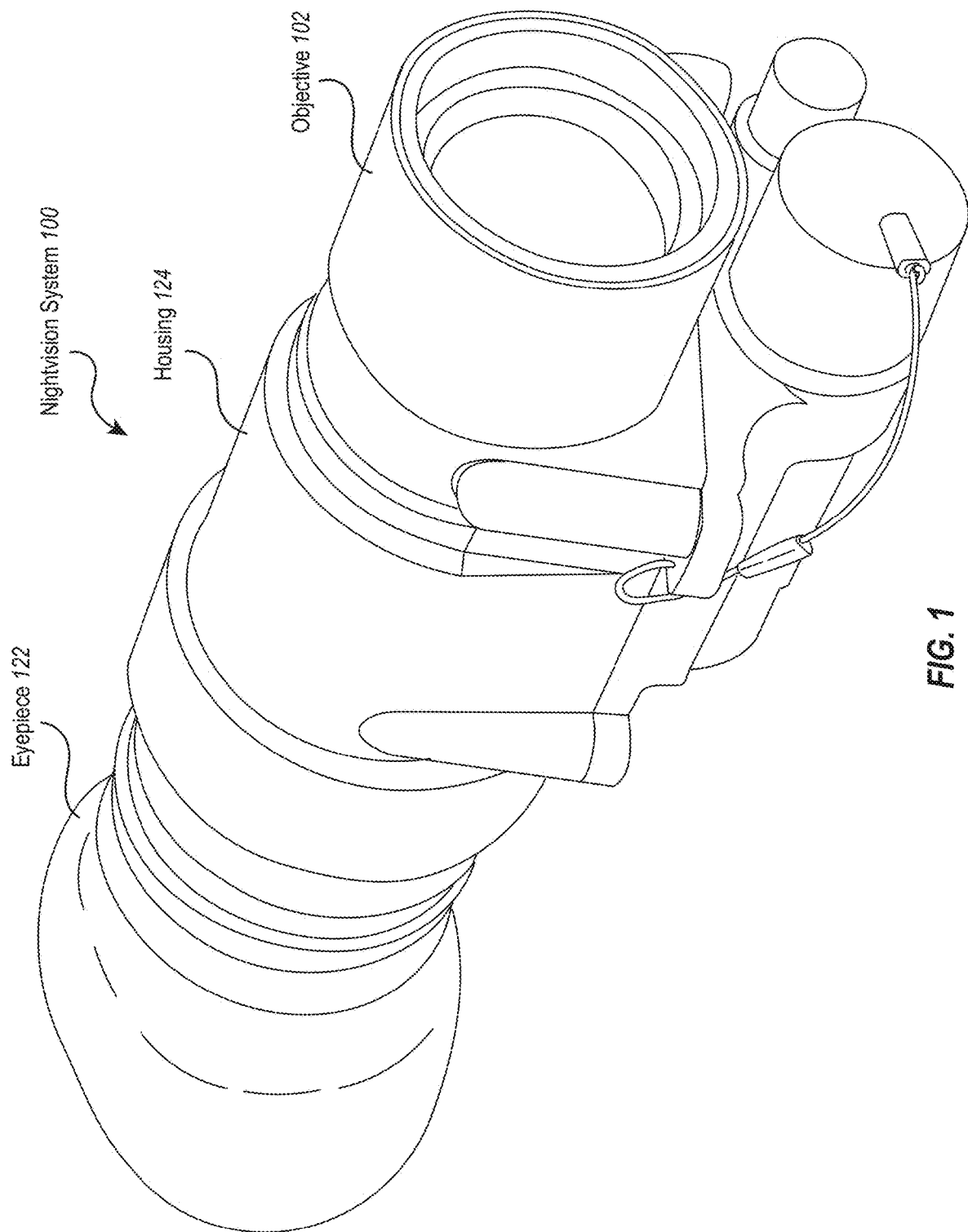
FIG. 1 illustrates a nightvision system.

Referring now to FIG. 1, a specific example of a nightvision system is illustrated. In particular, FIG. 1 illustrates the PVS-14 nightvision system 100. In the example illustrated, the nightvision system 100 includes a housing 124. As will be illustrated in more detail below in other figures, the housing 124 houses an image intensifier, a micro-display, and various other components. The nightvision system 100 further includes an objective 102 which receives weak light reflected and/or generated in an environment. The objective 102 includes optics such as lenses, waveguides, and/or other optical components for receiving and transmitting light to an image intensifier, discussed in more detail below. The nightvision system 100 further includes an eyepiece 122. The eyepiece 122 includes optics for focusing images created by the nightvision system 100, including images created by an image intensifier and images created by a micro-display, into the eye of the user.

Figure 2:
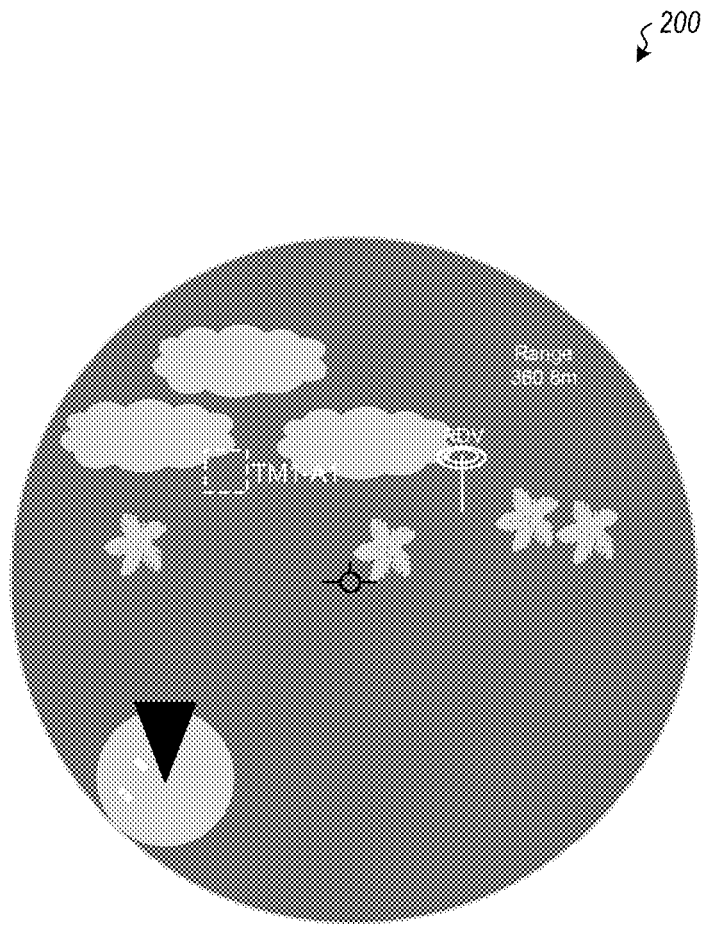
FIG. 2 illustrates a heads-up display displayed on a nightvision image.

As discussed above, and with reference to FIG. 2, it would be useful if modern ancillary functionality could be added to existing nightvision systems. FIG. 2 illustrates an image 200 including a heads-up display displayed on a nightvision image output from an intensifier tube. Some embodiments described herein are directed to implementing a heads-up display adding image overlay capabilities with a nightvision system.

The heads-up display may display to the user, in or around the field-of-view of an environment, various pieces of information. Such information may include, for example, a navigational heading, the speed at which the user is moving, coordinates, communication messages (such as email, SMS, etc.), time of day or other timing information, vital signs for the user such as heart rate or respiration rate, indicators indicating whether an object being viewed by the nightvision system is friendly or adversarial, battery charge level for the nightvision system or other devices, weather conditions, contact information, audio information (such as volume, playlist information, artist, etc.), etc.

Figure 3:
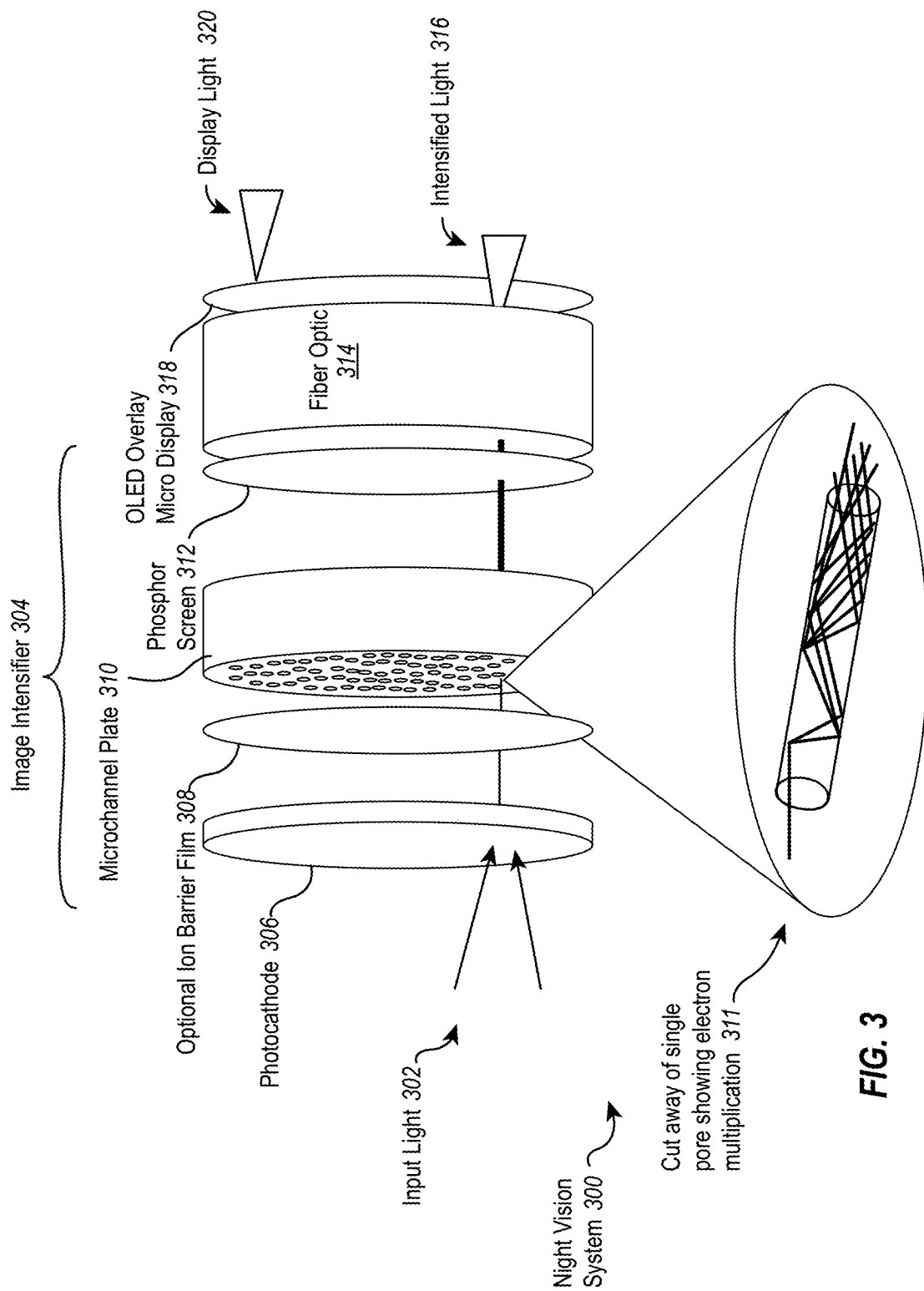
FIG. 3 illustrates a typical image intensifier with a fiber optic, and micro-display.

Attention is now directed to FIG. 3. FIG. 3 illustrates a block diagram version of a nightvision system 300. While not shown in FIG. 3, a nightvision system typically includes an objective (such as that shown in FIG. 1 at 102) to focus input light 302 into an image intensifier 304. Such input light may be, for example, from ambient sources, such as light from heavenly bodies such as stars, the moon, or even faint light from the setting sun. Additionally or alternatively, ambient sources could include light from buildings, automobiles, or other faint sources of light that cause reflection of light from an object being viewed in a nightvision environment into the objective. A second source of light may be light being emitted from an external source towards an object, reflected off the object, and into the objective. For example, the source may be an infrared source that is not viewable in the viewable spectrum for human observers. A third source of light may be light emitted by an object itself. For example, this may be related to infrared heat energy emitted by the object and directed into the objective. Nonetheless, the nightvision system is able to convert the light emitted from the source into a viewable image for the user.

The objective directs any input light 302 into the image intensifier 304. Note that the image intensifier 304 may include functionality for amplifying light received from the objective to create a sufficiently strong image that can be viewed by the user. This may be accomplished using various technologies such as a photocathode 306, a microchannel plate 310, and a phosphor screen 312. The photocathode 306 may be configured to generate photo electrons in response to incoming photons.

FIG. 3 illustrates additional details regarding the image intensifier 304. The input light 302 passes through a photocathode 306. The photocathode outputs electrons when photons strike the photocathode. The electrons may pass through an optional ion barrier film 308. The ion barrier film 308 filters certain radiation to protect other components in the image intensifier 304, such as the microchannel plate 310. In particular, the ion barrier film 308 can increase the lifespan of the image intensifier 304 by limiting and/or preventing certain harmful radiation.

Electrons from the photocathode 306 are emitted into the microchannel plate 310. As illustrated in FIG. 3 by the cutaway of a single poor showing electron multiplication 311, electrons are multiplied in the microchannel plate 310.

Electrons are emitted from the microchannel plate 310 to a phosphor screen 312 which glows as a result of electrons striking the phosphor screen 312. This creates an image from the input light 302.

A fiber-optic 314 carries this image as intensified light 316 to the eyepiece of a nightvision system where it can be output to the user.

FIG. 3 further illustrates the micro-display 318. As discussed above, the micro-display 318 may include functionality for displaying information to a user. Such information may include graphical content, including text, images, and the like. In some embodiments, the micro-display may display in multiple grayscale shades. Alternatively, or additionally, the micro-display may display in multiple colors or 1-bit monochrome.

In the example illustrated in FIG. 3, the micro-display 318 outputs display light 320 which can be sent to the eyepiece (such as the eyepiece 122 illustrated in FIG. 1). As noted previously, the intensified light 316 is also provided to the eyepiece. Thus, an image such as that illustrated in FIG. 2 is presented to the user in the nightvision system.

As noted previously, the micro-display 318 is composed of a number of active silicon areas. In particular, the micro-display 318 is a digital display having a certain pixel density. Each pixel has one or more transistors controlling one or more OLEDs.

Figure 4:
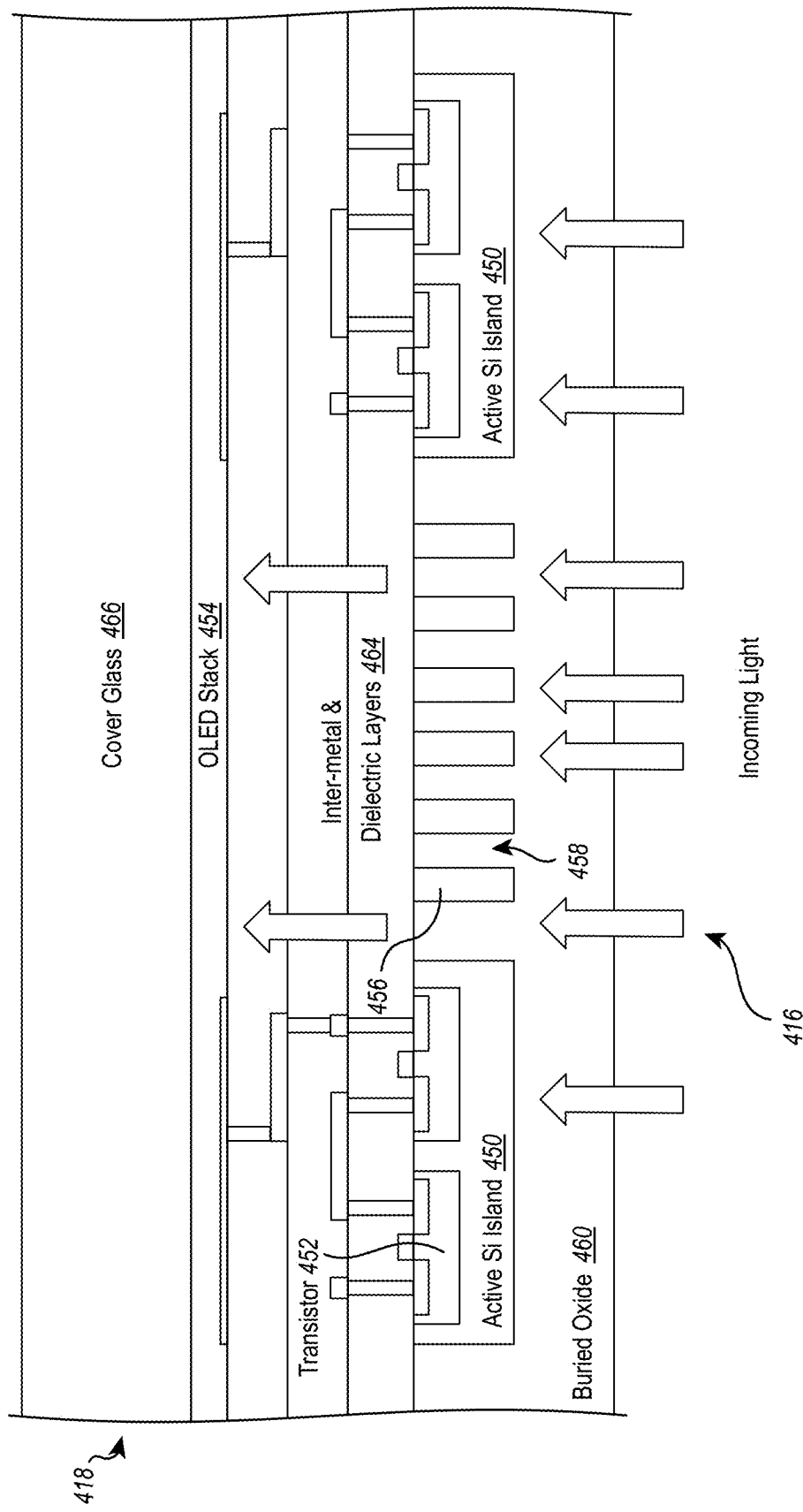
FIG. 4 illustrates a portion of a micro-display with areas of non-active silicon.

Reference is now made to FIG. 4 which illustrates a micro-display portion 418 including active silicon areas shown as active silicon islands (which may be native silicon islands) such as active silicon island 450. In particular, active silicon islands include transistors such as transistor 452 which control OLEDs in an OLED stack 454. In the example illustrated in FIG. 4, each of the active silicon islands represents a pixel of the micro-display portion 418. Thus, by illuminating various LEDs in the OLED stack 454 using the transistors in the active silicon islands, an image can be created and output to a user, such as by outputting display light such as the display light 320 illustrated in FIG. 3.

However, as illustrated in FIG. 3, intensified light 316 must be transmitted through the micro-display 318 to the eyepiece of the nightvision system, and then to the user. However, as discussed previously, silicon will block the intensified light 316. For example, in FIG. 4, incoming light 416 is equivalent to the intensified light 316 illustrated in FIG. 3. Further, as illustrated in FIG. 4, the incoming light 416 will be blocked by the active silicon islands as well as mostly blocked by non-active silicon islands (which may be native silicon islands) separating the active silicon islands from each other (such as non-active silicon island 456).

Previously, this could be at least somewhat mitigated by including oxide trenches also separating active silicon islands from each other (such as oxide trench 458) as illustrated in FIG. 4. The oxide trenches and buried oxide 460 allow the incoming light 416 to pass through to the various inter-metal and dielectric layers 464, the OLED stack 454, through a transparent cover, which may be a type of glass, as illustrated by cover glass 466, and to the eyepiece where the incoming light 416 can be output to the user. However, nonetheless, some of the incoming light 416 will be blocked by the non-active silicon islands.

Thus, embodiments illustrated herein remove silicon between the active silicon islands to allow for more light to be transmitted through the micro-display. An example of this is illustrated in FIG. 5.

Figure 5:
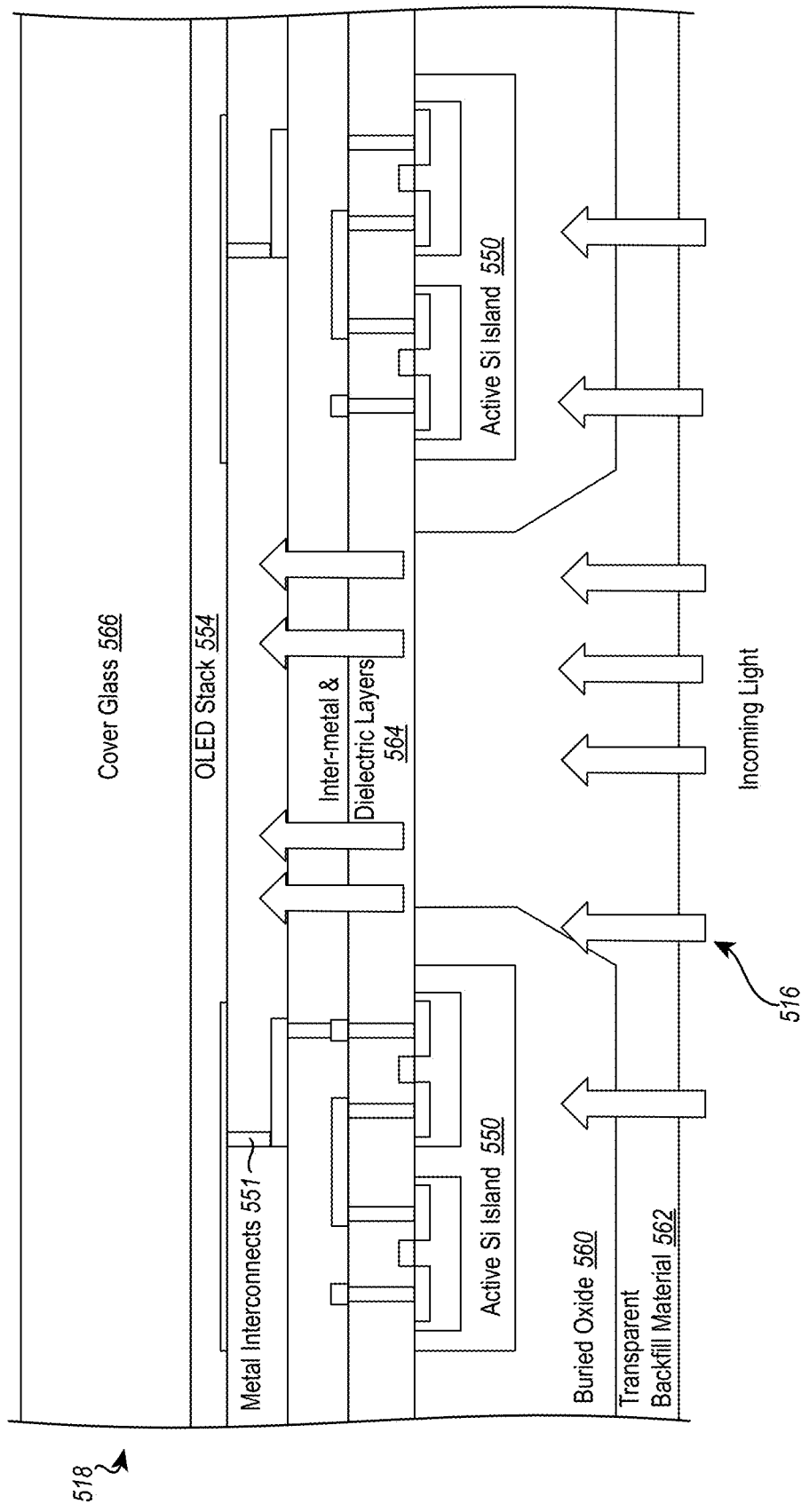
FIG. 5 illustrates a portion of a micro-display with areas of non-active silicon having been removed.

FIG. 5 illustrates an alternative version of a micro-display portion 518. In this example, non-active silicon islands have been removed as compared to the non-active silicon islands illustrated in FIG. 4 such that the active silicon islands are separated from each other by space created by non-active silicon islands and oxide trenches having been removed. This allows the incoming light 516 to pass through an optional transparent backfill material 562, potentially a portion of the buried oxide 560, through various dielectric layers 564, through the OLED stack 554, and through a cover glass 566 attached to the OLED stack 554. The incoming light 516 allowed to pass through these various layers of the micro-display portion 518 can be transmitted to the eyepiece where the user can then view images produced by the OLED stack 554 as well as the incoming light 516.

Note that some of the incoming light 516 will continue to be blocked by the active silicon islands, such as active silicon island 550, and metal interconnects 661. Further, as will be illustrated in more detail below, some non-active silicon islands may be allowed to remain in the micro-display under metal trace portions of the micro-display to provide support for those metal trace portions.

However, transmission of light through the micro-display is nonetheless increased by removing portions of silicon that are not needed for implementing active electrical components or for supporting metal traces. For example, consider an example where dynamic pixel cells are used. In this particular example, there are two sub pixels per pixel. Anode size for the sub pixels is 8 µm×5.1 µm. Pixel area is 10.1 µm×12.4 µm. Pixel size is 22.5 µm×22.5 µm. This provides a resolution of 800×800. In this particular micro-display, if the non-active silicon islands are not removed, transparency of the micro-display is about 33%. In contrast, transparency is about 61% if the non-active silicon islands are removed such as in the structure illustrated in FIG. 5. Thus, in this example, transparency of a micro-display is increased by more than 80% by removing silicon and/or oxide trenches.

Note that various engineering trade-offs can be made to meet certain requirements. For example, increased transparency can be obtained by having a lower resolution and/or using fewer sub pixels as there is more space between pixels and/or sub pixels. If a higher resolution is needed, then that micro-display will have a lower transparency than an equivalently sized micro-display with a lower resolution. Thus, for example, a micro-display with a 36 µm pitch can obtain a transparency of 81%, while a micro-display of 22.5 µm pitch can obtain a transparency of 67%, while a micro-display having a 17.5 µm pitch will be about 55% transparency when non-active silicon islands are removed from the micro-display in each of the illustrated examples. Thus, some embodiments may be able to create a micro-display with at least a 36 µm pitch with at least a transparency of 75%, or a micro-display of at least a 22.5 µm pitch with at least a transparency of 60%, or a micro-display having at least a 17.5 µm pitch with at least a 50% transparency when silicon is removed between active silicon areas. The preceding illustrates one specific example related to a particular manufacturing process.

Pitch and transparency values will be specific to a given semiconductor manufacturing process—also known as the technology or process node—and will of course vary as the node changes. Typically designating the process's minimum feature size, the technology node will dictate the amount of required active silicon for the display CMOS based on the transistor size. As the node minimum feature size decreases, whether it be through alternate foundries or improvements in technology, the same need for maximizing transparency applies. Indeed, the benefit to removing non-active silicon islands improves as the ratio of inactive- to active-silicon increases with smaller transistors.

The example numbers described herein are derived assuming a 180 nm technology/process node, although similar calculations can be performed for any specific technology size.

Note that the non-active silicon islands included in the structure in FIG. 4 are included to provide mechanical structure. However, once the cover glass 466 has been attached, that additional structure is no longer needed. Thus, as illustrated in FIG. 5, the non-active silicon islands can be removed, and appropriate structure can still be maintained using the cover glass 566.

Figure 6:
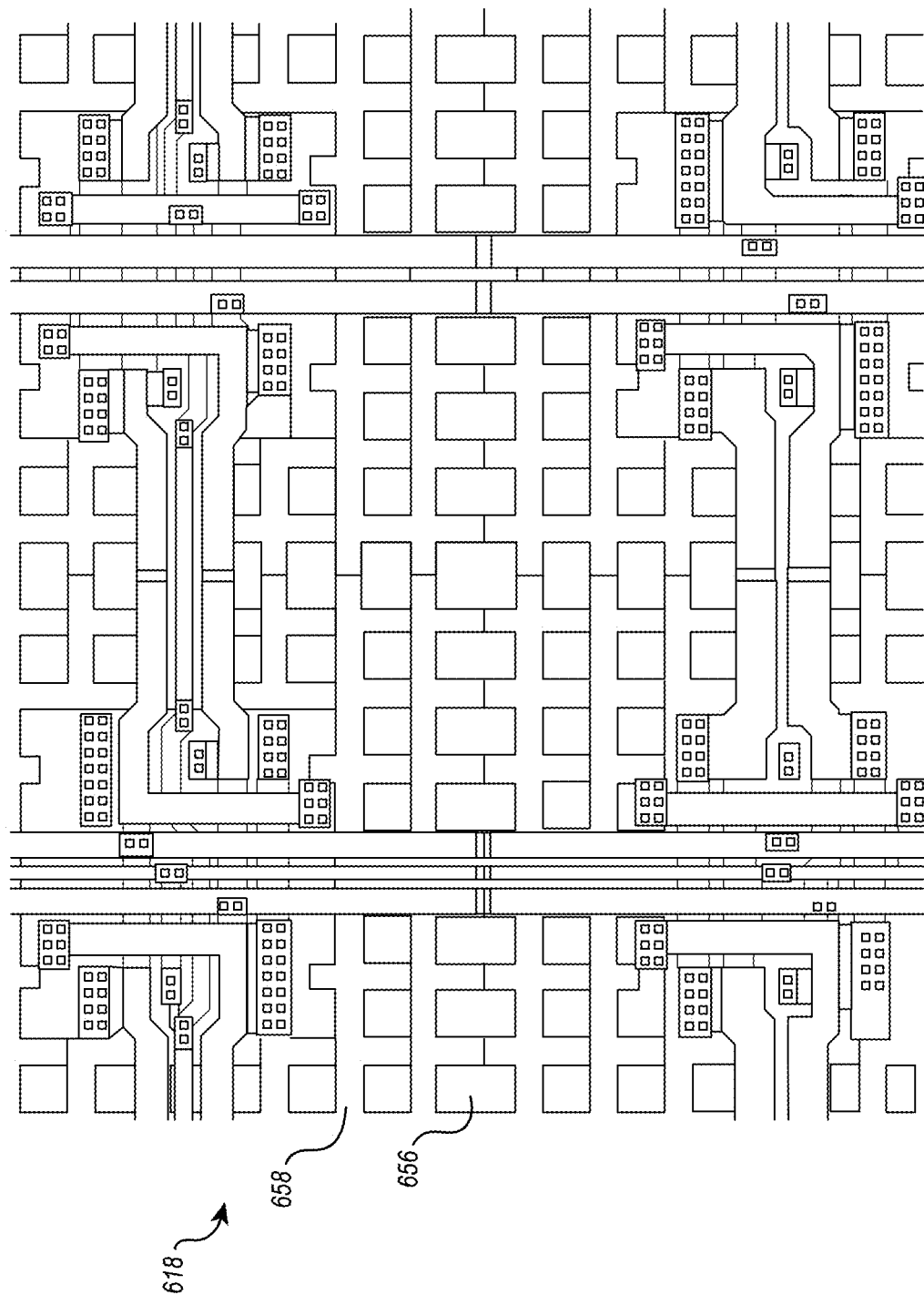
FIG. 6 illustrates a portion of a micro-display with areas of non-active silicon.
Figure 7:
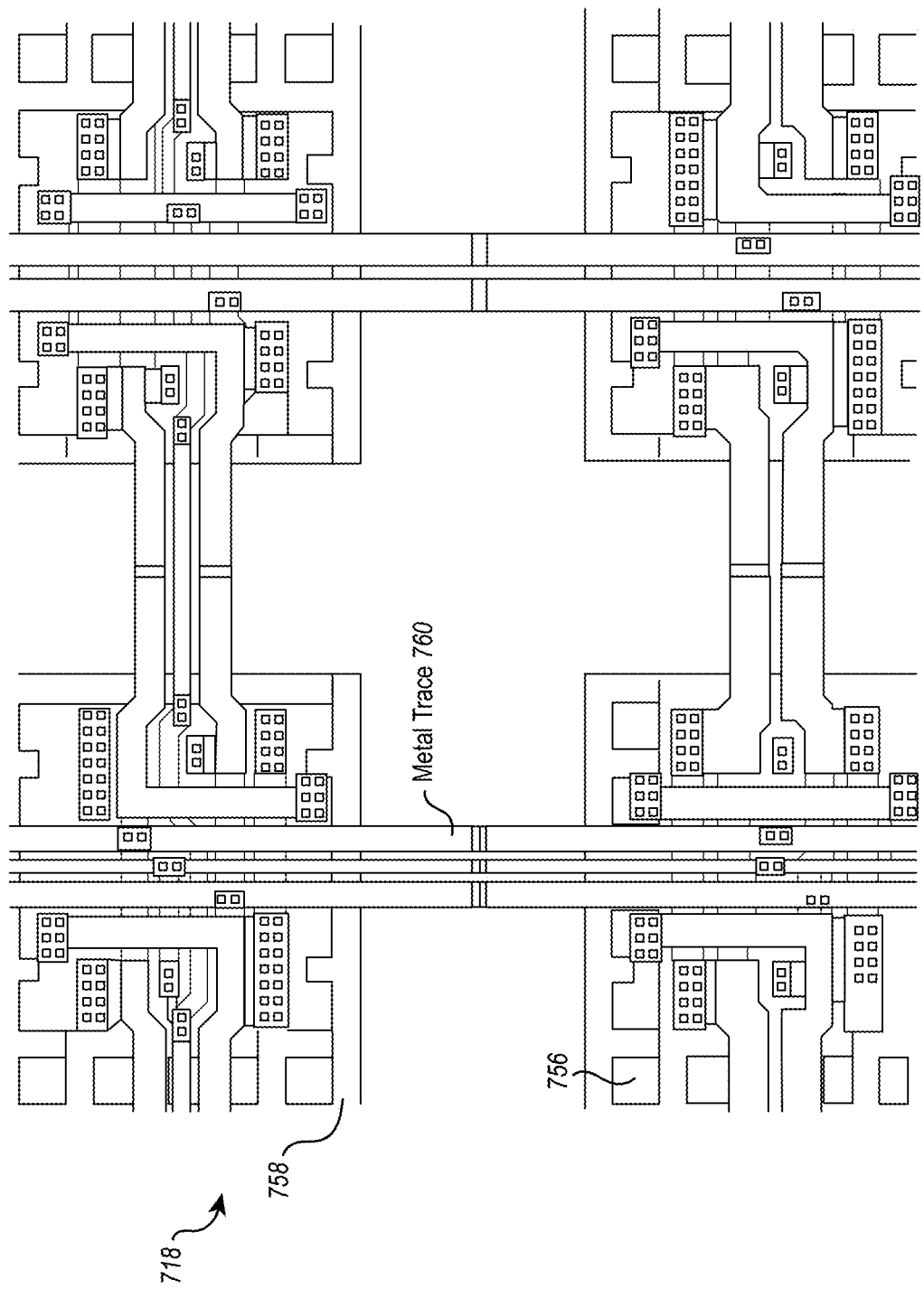
FIG. 7 illustrates a portion of a micro-display with areas of non-active silicon having been removed.

Referring now to FIGS. 6 and 7, top views of micro-display portions are illustrated. In FIG. 6, an example similar to that in FIG. 4 where the micro-display portion 618 includes non-active silicon islands (e.g., non-active silicon island 656) and oxide trenches (such as oxide trench 658). As discussed previously, the non-active silicon islands do not allow light to pass through certain areas of the micro-display portion 618 which will block portions of light from an image intensifier.

In contrast, FIG. 7 illustrates an example of a micro-display portion 718 where non-active silicon islands (such as non-active silicon island 756) are maintained beneath transistors and metal traces (such as metal trace 760) but are removed from other portions of the micro-display portion for 718. Note that oxide trenches (such as oxide trench 758) can still be maintained in conjunction with the non-active silicon islands included under metal traces to increase transmission even through those areas.

Referring now to FIGS. 8A through 8G, an illustrative process is disclosed showing how non-active silicon islands (such as non-active silicon island 856) can be removed from a micro-display. It should be appreciated that the process illustrated is typically performed on a wafer comprising a plurality of micro-displays as opposed to on a single display itself. However, the process will be illustrated with reference to a particular micro-display portion 818.

Figure 8A:
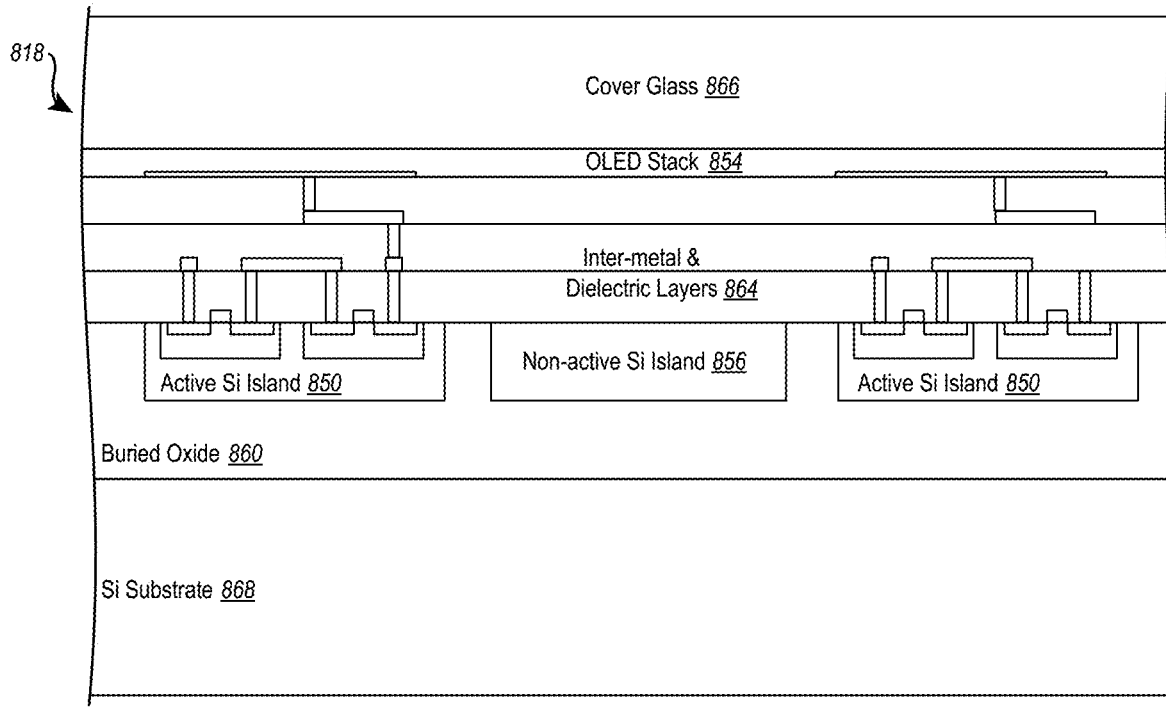
FIGS. 8A-8G illustrate a method of fabricating a micro-display to remove areas of non-active silicon.

In FIG. 8A, a design compliant silicon oxide wafer is received from a foundry. In one particular example, for a particular foundry, the design compliant wafer will have oxide trenches (e.g., trench 858) of no larger than 1 µm. As noted above, this may differ from other foundries, but virtually all foundries will require some native silicon remain between active regions. The design compliant wafer will be delivered with a silicon substrate 868. Note that while this example describes the wafer being supplied from a foundry, it should be appreciated that in other embodiments, the wafer can be prepared in a single location, or by multiple entities performing various operations on the wafer.

The OLED stack 854 will be added to the design compliant wafer. Additionally, the cover glass 866 will be added to the design compliant wafer.

Figure 8B:
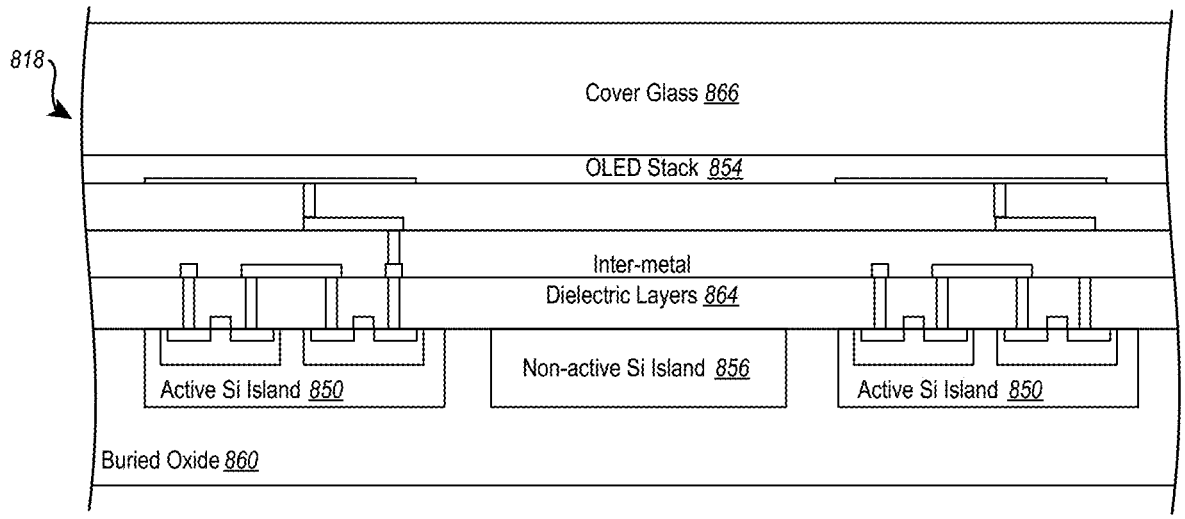

Once the cover glass 866 has been added to the design compliant wafer, the substrate 868 can be removed as illustrated in FIG. 8B. This can be performed by grinding, etching, or other appropriate process.

Figure 8C:
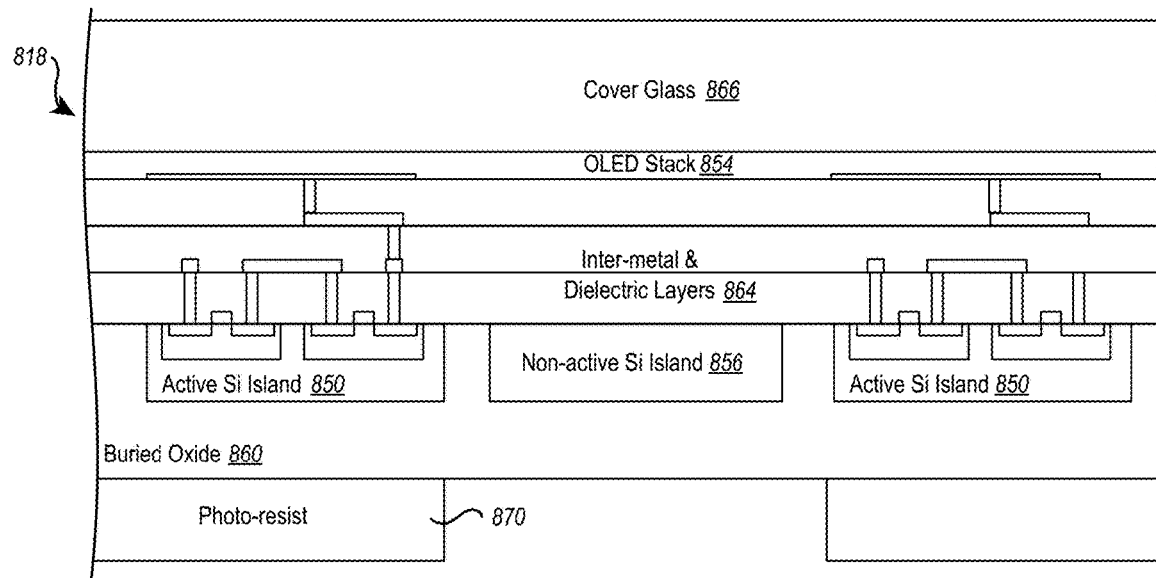
Figure 8D:
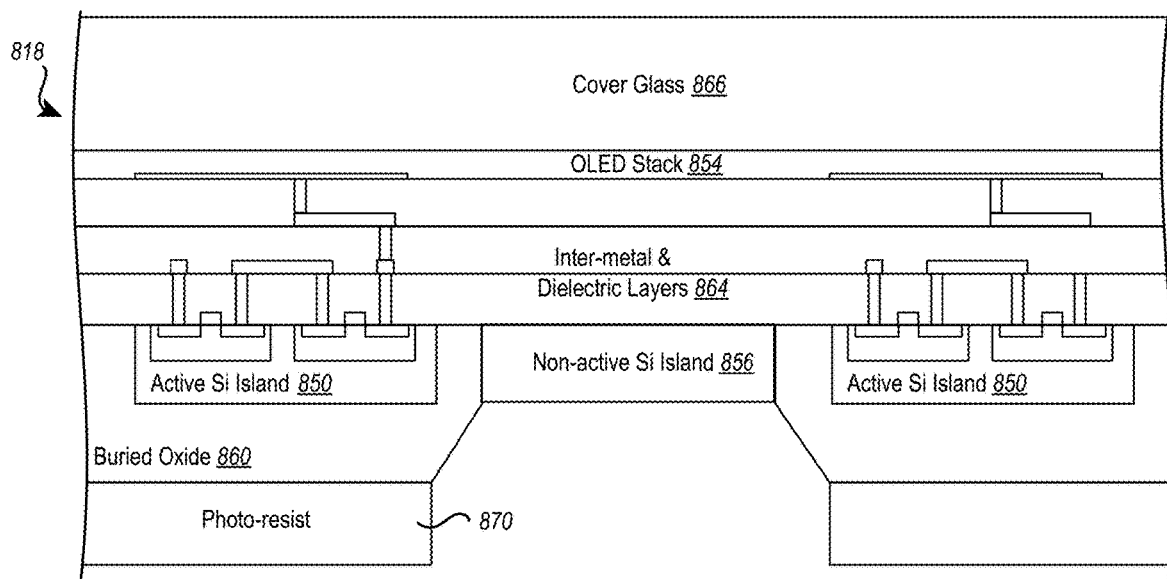
Figure 8E:
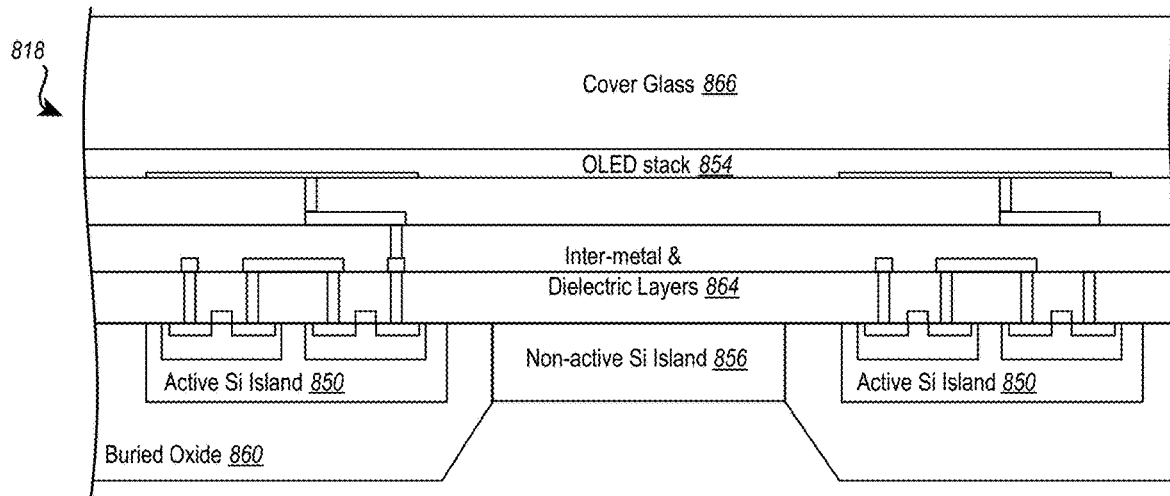
Figure 8F:
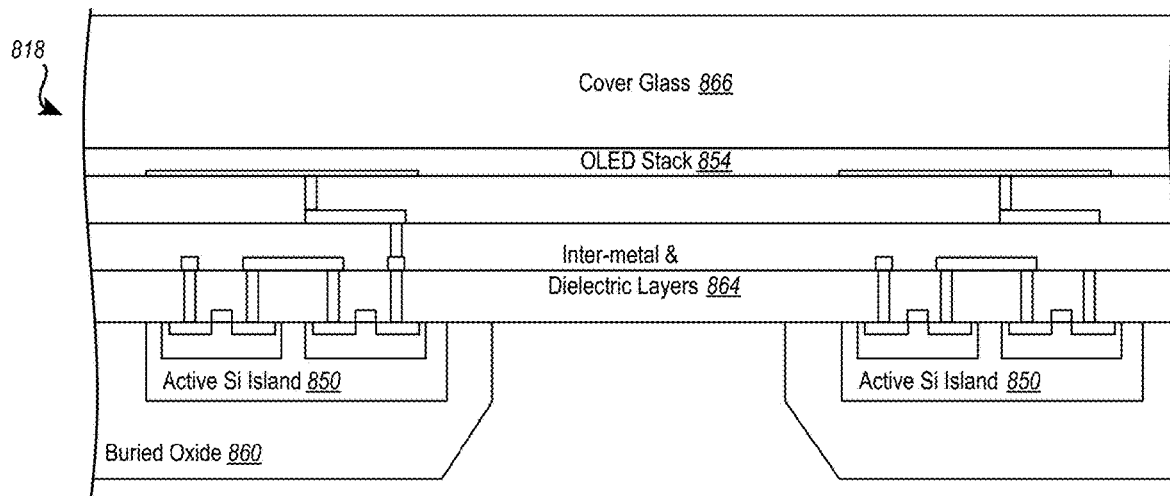
Figure 8G:
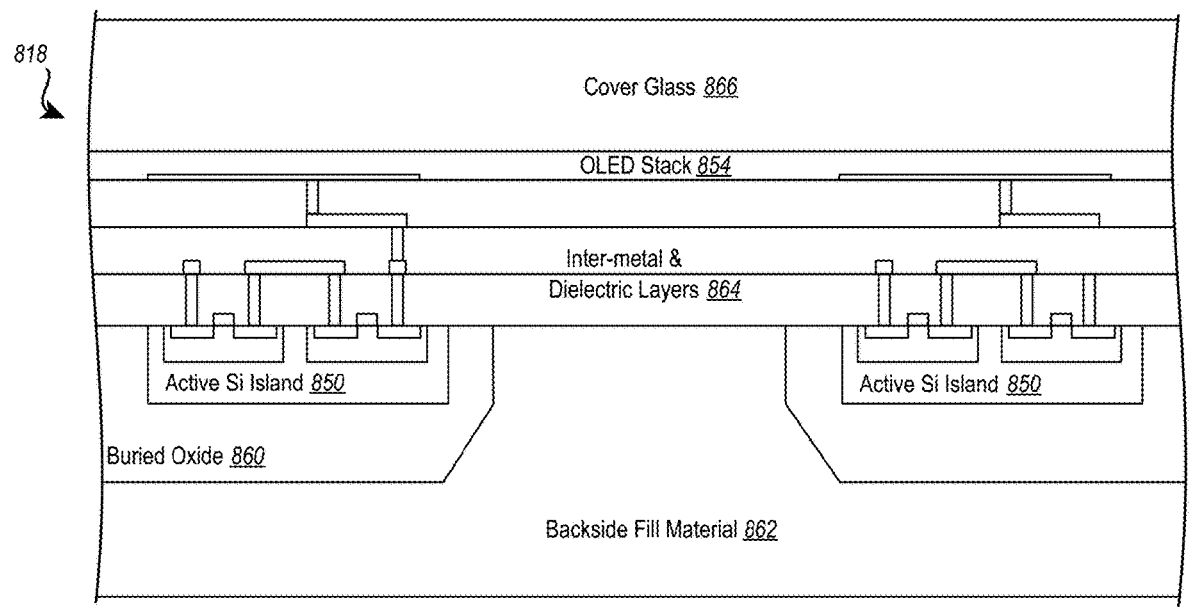

As illustrated in FIG. 8C, photoresist 870 is added over the active islands (e.g., island 850). As illustrated in FIG. 8D, a buried oxide etch is performed to etch away a portion of the buried oxide 860 down to the non-active silicon islands 856. As illustrated in FIG. 8E, the photoresist 870 is removed. As illustrated in FIG. 8F, a selective silicon etch using the remaining buried oxide 860 as a hard mask is performed to etch away the non-active silicon islands 856. As illustrated in FIG. 8G, a backside fill material 862 is optionally applied. For example, this backside fill material may be epoxy such as a two-part epoxy, a lens bond for coupling the micro-display to a fiber-optic as illustrated previously herein, an oxide material, or other material. Note that in some embodiments no backside fill material is used.

Figure 9:
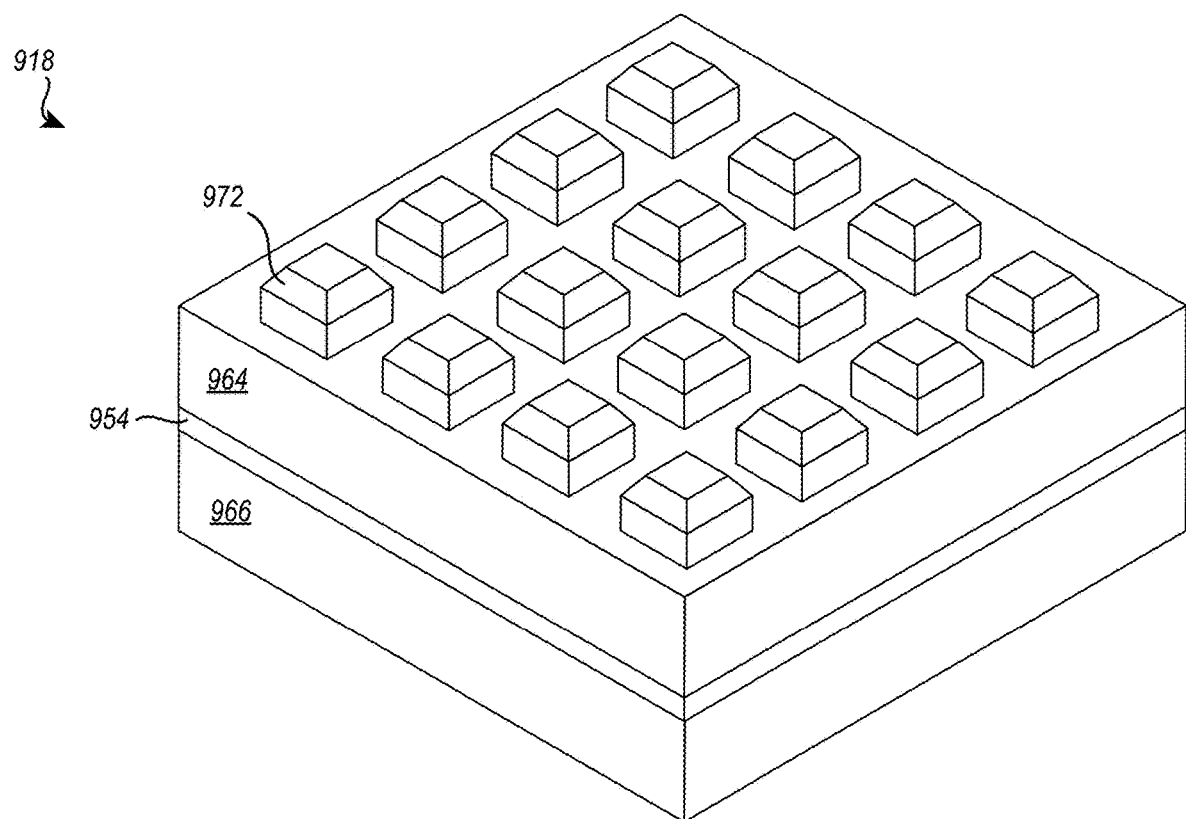
FIG. 9 illustrates a perspective view of a portion of a micro-display with areas of non-active silicon having been removed.

Referring now to FIG. 9, a micro-display portion 918 is shown. This example of a micro-display portion 918 is similar to what might be seen when looking at an example of a micro-display portion 818 at the step illustrated in FIG. 8F. However, FIG. 9 illustrates the micro-display portion 918 in a perspective view and with the cover glass 966 shown at the bottom of the figure as opposed to the top of the figure as illustrated in FIG. 8F. Nonetheless, FIG. 9 illustrates the cover glass 966 coupled to the OLED stack 954, coupled to the inter-metal dielectric layers 964, and showing mesas (such as mesa 972) which include active silicon covered by silicon dioxide. Note that in this example, no backside fill material is shown. As discussed previously, the backside fill material is optional, and does not need to be included in the finished micro-display.

Referring now to FIGS. 10A through 10H, another process is illustrated for creating micro-displays with enhanced transparency by removal of silicon. In this example, a wafer is provided from the foundry. However, in the particular example, the wafer does not include a buried oxide layer such as is included in the example illustrated in FIG. 8A. Instead, the silicon substrate 1068 extends to the transistors and the inter-metal and dielectric layers 1064. An OLED stack 1054 is added, as well as the cover glass 1066.

Figure 10A:
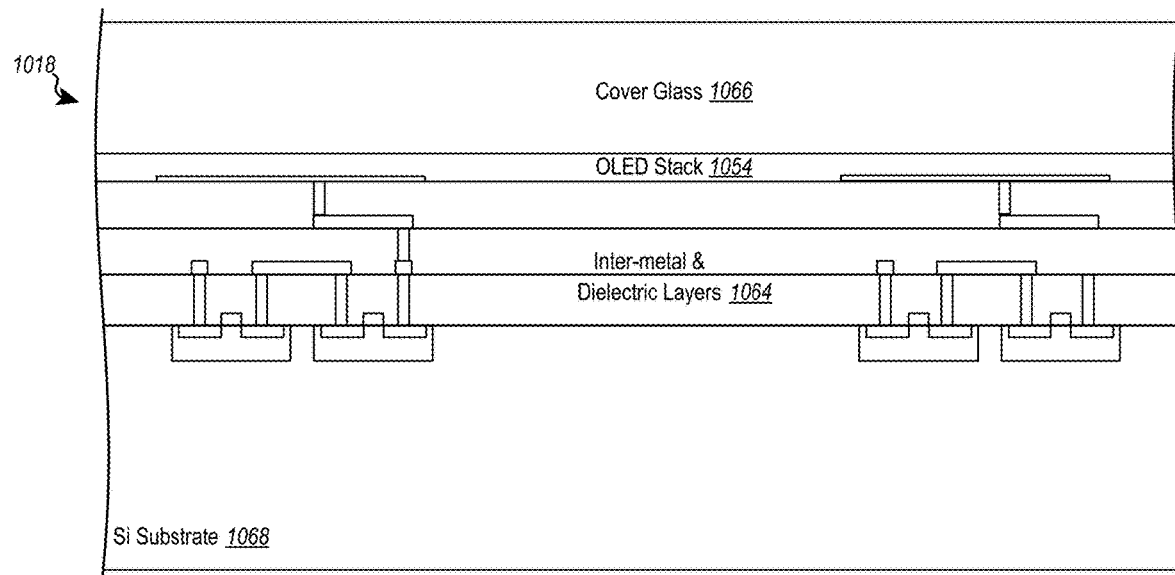
FIGS. 10A-10H illustrate an alternate method of fabricating a micro-display to remove areas of non-active silicon.
Figure 10B:
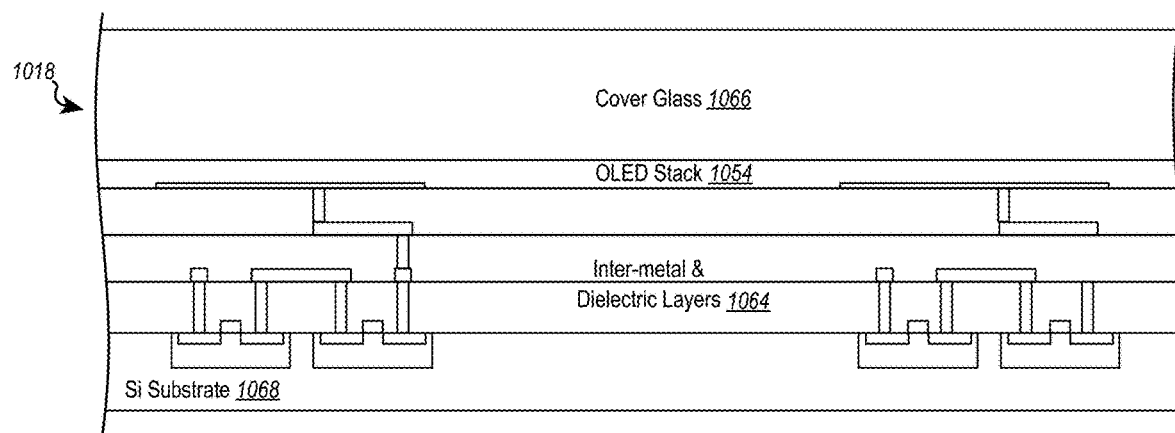

As illustrated in FIG. 10B, once the cover glass 1066 has been attached to the wafer, a portion of the silicon substrate 1068 can be removed. This may be accomplished, for example by grinding or etching the silicon substrate 1068 or other methods to remove a portion of the silicon substrate 1068.

Figure 10C:
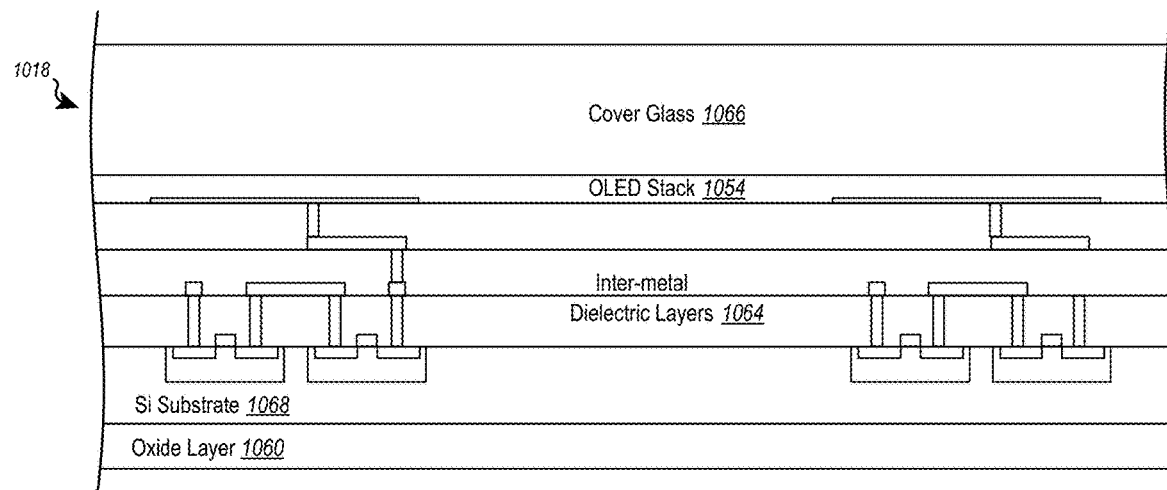
Figure 10D:
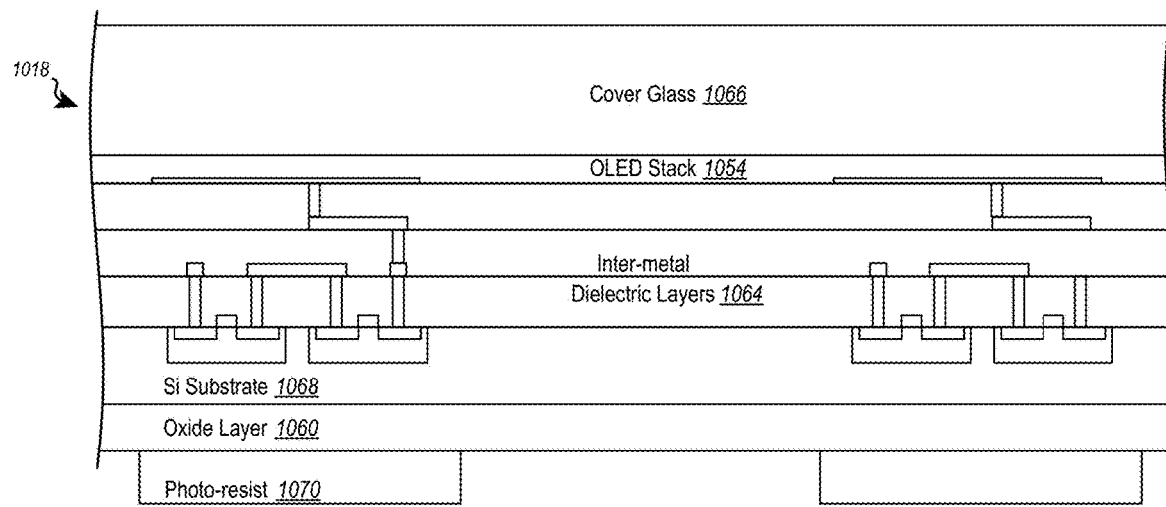
Figure 10E:
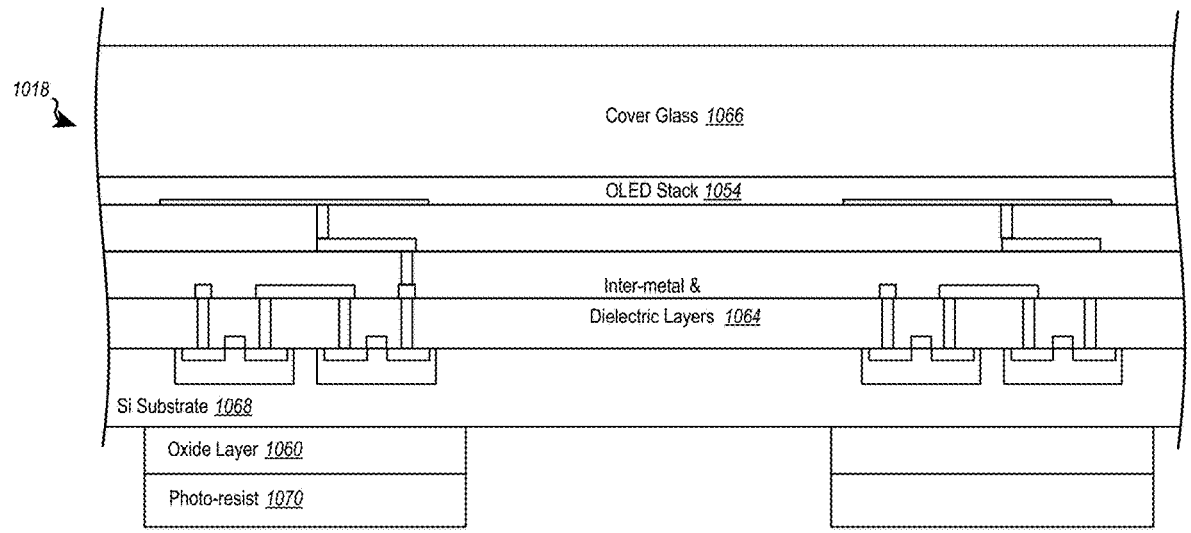
Figure 10F:
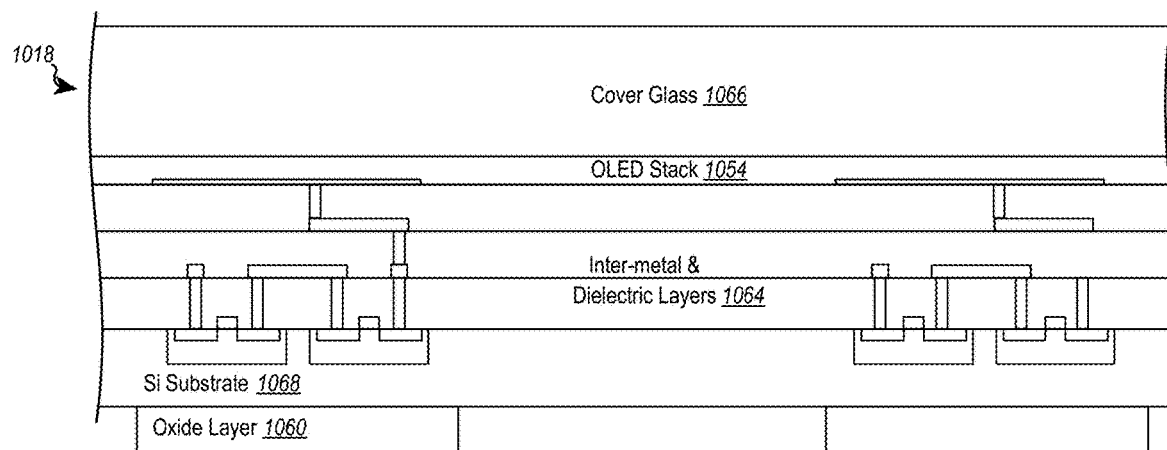
Figure 10G:
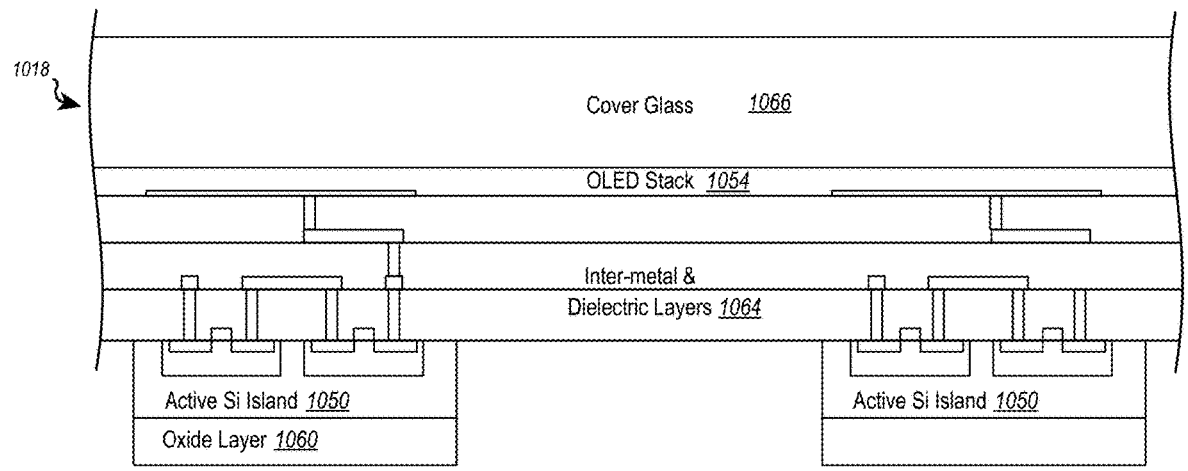
Figure 10H:
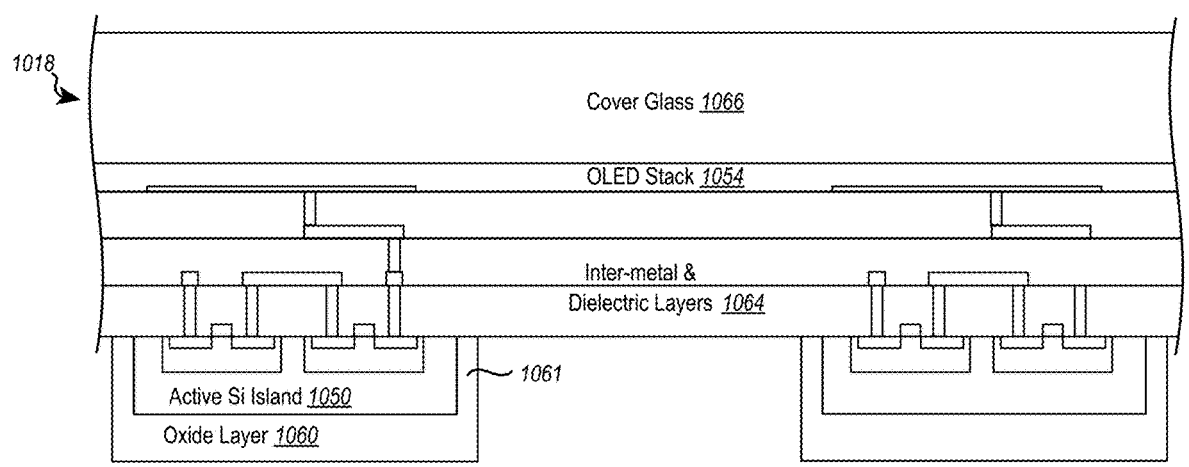

As illustrated in FIG. 10C, and oxide layer 1060 can be grown on the silicon substrate 1068. As illustrated in FIG. 10D, photoresist 1070 may be applied to the oxide layer 1060 over the transistors as shown in the figure. As illustrated in FIG. 10E, and oxide etch may be performed to remove portions of the oxide layer 1060. As illustrated in FIG. 10F, the photoresist 1070 may be removed. As illustrated in FIG. 10G, a silicon etch may be performed to remove portions of the silicon substrate 1068 between active areas of the micro-display portion 1018 to form the active silicon islands 1050. As illustrated in FIG. 10H, additional oxide walls 1061 can be grown around exposed areas of the active silicon islands 1050. This will protect the active areas from air, moisture, contaminants, etc.

As illustrated, unneeded silicon can be removed from between active areas of the micro-display so as to allow more light to be transmitted through the micro-display. Thus, FIGS. 10A through 10H illustrate a process that can be used to remove such unneeded silicon, and thus create a more transparent micro-display.

Figure 11A:
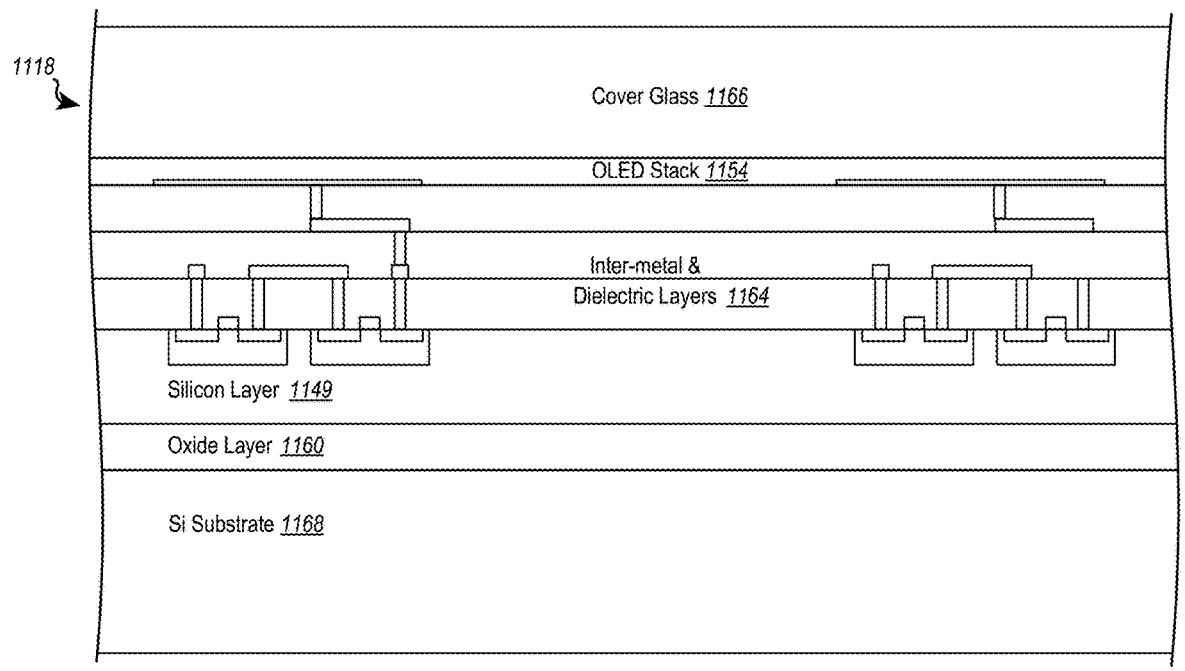
FIGS. 11A-11G illustrate an alternate method of fabricating a micro-display to remove areas of non-active silicon.
Figure 11B:
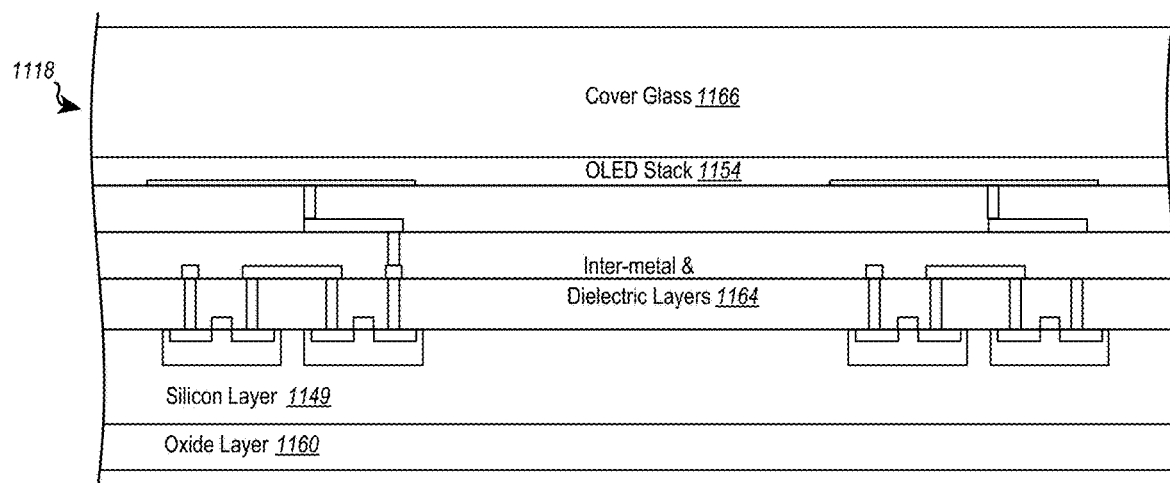

Referring now to FIGS. 11A through 11E, yet another process is illustrated whereby a micro-display with increased light transmission as compared to previously implemented micro-displays, is illustrated. In the example illustrated in FIG. 11A, a buried oxide layer 1160 is included in the micro-display portion 1118. Typically, a foundry will deliver a wafer with the layers shown in FIG. 11A minus the OLED stack 1154 and the cover glass 1166. Thus, once the OLED stack 1154 and cover glass 1166 have been applied to the micro-display portion 1118, the processing illustrated in FIGS. 11A through 11G can be performed. FIG. 11B illustrates that the substrate 1168 is removed. As discussed previously, this can be performed by grinding, etching, or other appropriate operations.

Figure 11C:
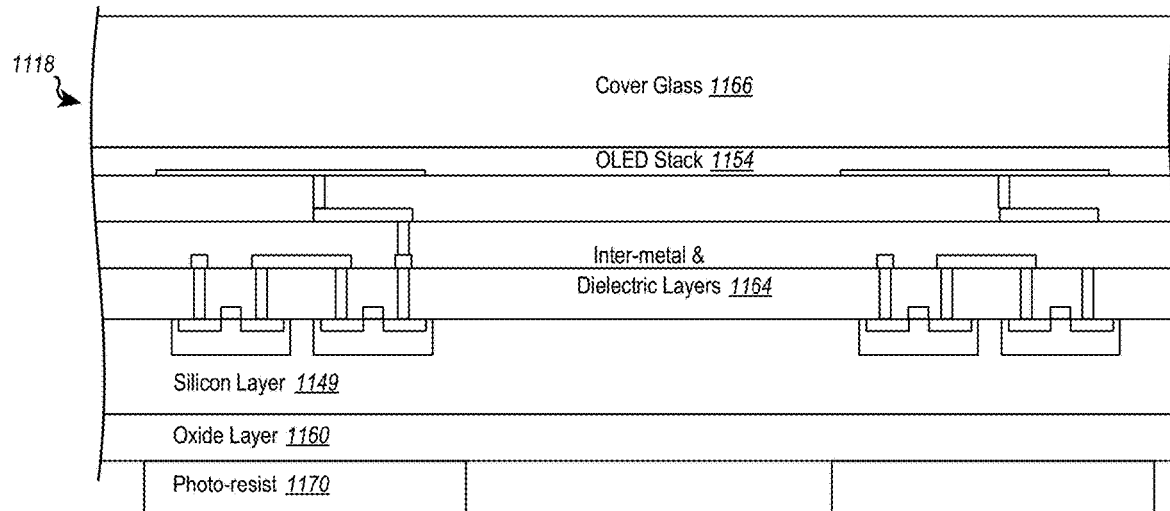
Figure 11D:
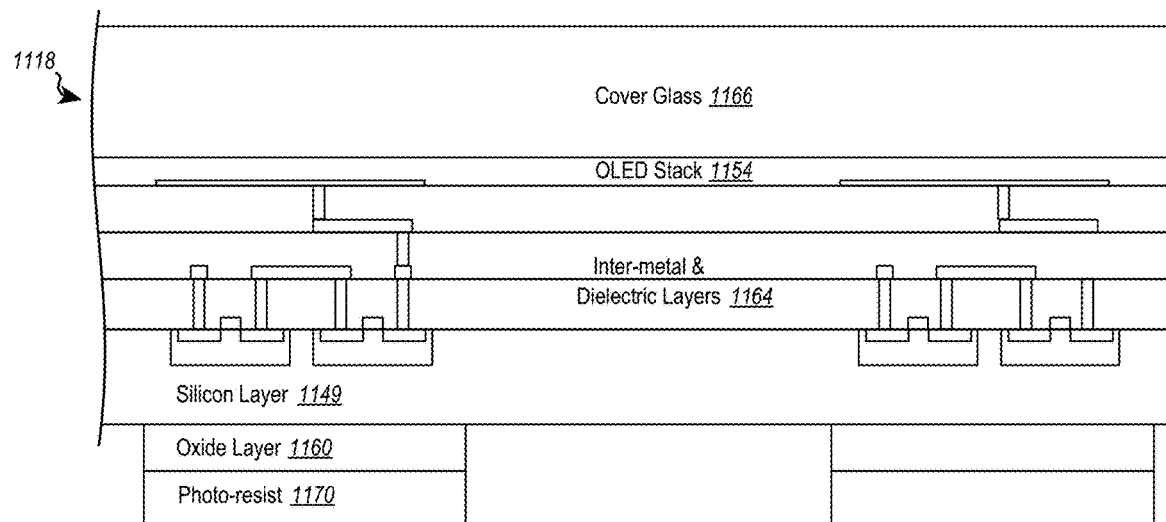
Figure 11E:
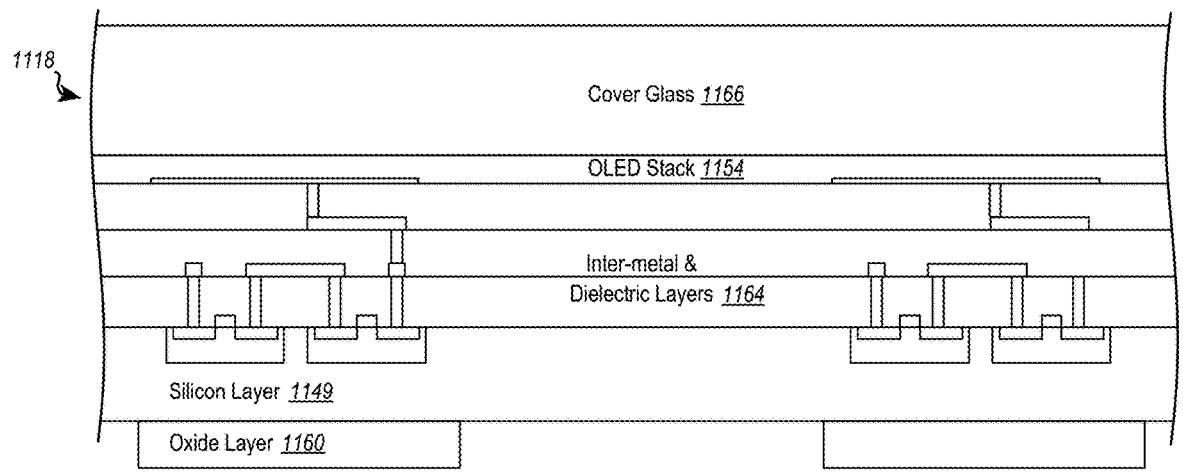
Figure 11F:
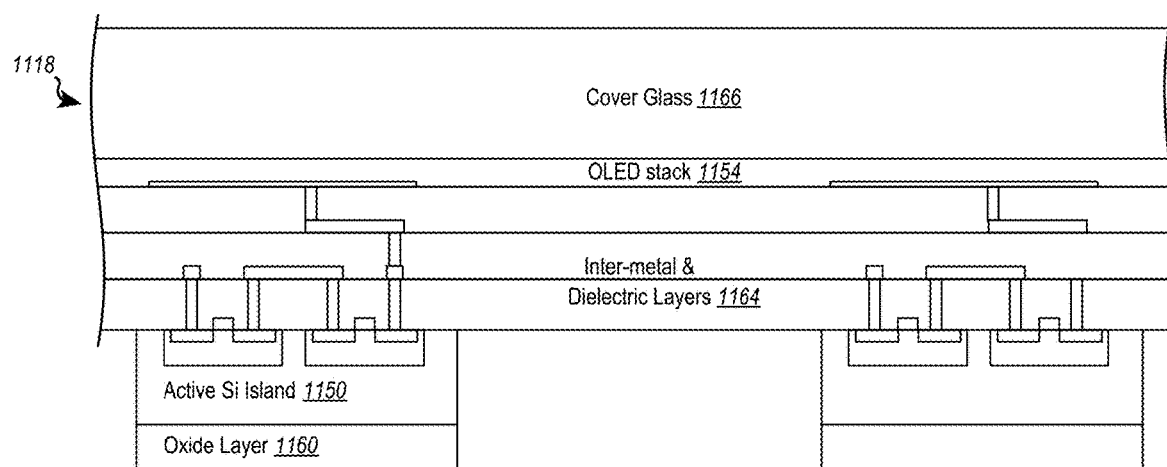
Figure 11G:
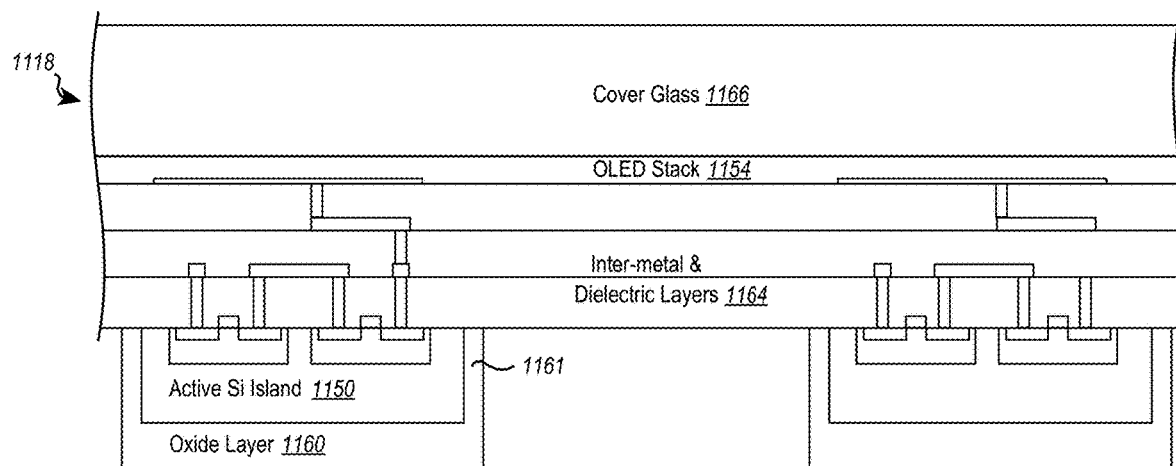

As illustrated in FIG. 11C, photoresist 1170 is applied over the active areas of the micro-display portion 1118 (and potentially metal traces). As illustrated in FIG. 11D, an oxide etch is performed to remove portions of the buried oxide 1160. As illustrated in FIG. 11E, the photoresist 1170 is removed. As illustrated in FIG. 11F, a selective silicon etch is performed to remove portions of the silicon layer 1149 down to the inter-metal and dielectric layers 1164 to form the active silicon island 1150. As illustrated in FIG. 11G, additional oxide walls 1161 are grown to protect the exposed areas of the active silicon island 1149. Thus, an alternative example of a process that may be used to remove unneeded silicon is illustrated. Again, as discussed previously, removal of the unneeded silicon increases transparency of the micro-display portion 1118 as compared to previous micro-displays which relied on oxide deep trenches for increasing transparency.

In the examples above it should be noted that although not shown various alternatives can be implemented. For example, in any of the embodiments illustrated, a backside fill may be used or may be omitted. Alternatively, or additionally, while the active areas have been shown as being substantially square in nature, it should be appreciated that the active areas may be rectangular or other appropriate shapes.

The discussion above refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of increasing transparency of one or more micro-displays, the method comprising:
    attaching a transparent cover to at least a portion of a semiconductor wafer, the at least a portion of the semiconductor wafer comprising the one or more micro-displays, the one or more micro-displays comprising one or more active silicon areas; and
    after the transparent cover has been attached to the at least a portion of the semiconductor wafer, removing silicon between one or more of the active silicon areas, wherein removing silicon between one or more of the active silicon areas causes the one or more micro-displays to have a transparency for incoming light coming into the one or more micro-displays and through the one or more micro-displays of at least 50%.

2. The method of claim 1, wherein the transparent cover comprises a glass material.

3. The method of claim 1, further comprising adding an OLED stack to the portion of a semiconductor wafer.

4. The method of claim 1, wherein removing silicon between the one or more of the active silicon areas comprises removing non-active silicon islands formed by forming oxide trenches in silicon of the at least a portion of a semiconductor wafer.

5. The method of claim 1, wherein removing silicon between the one or more of the active silicon areas comprises removing portions of a silicon substrate to form active silicon islands.

6. The method of claim 1, further comprising removing portions of a silicon oxide covering the silicon between the one or more of the active silicon areas and using remaining portions of the silicon oxide as a mask for removing the silicon between the one or more of the active silicon areas.

7. The method of claim 1, further comprising filling an area between with active silicon areas with a backside fill material.

8. The method of claim 1, further comprising coupling one of the micro-displays to a fiber optic coupled to an image intensifier of a night-vision system to cause a digital heads-up display to be displayed in conjunction with an analog night vision image by light from the analog night vision image being transmitted through the micro-display.

9. The method of claim 1, wherein at least one of the micro-displays comprises at least a 36 µm pitch and has a transparency of at least 75% as a result of removing silicon between one or more of the active silicon areas.

10. The method of claim 1, wherein at least one of the micro-displays comprises at least a 22.5 µm pitch and has a transparency of at least 60% as a result of removing silicon between one or more of the active silicon areas.

11. The method of claim 1, wherein at least one of the micro-displays comprises at least a 17.5 µm pitch and has a transparency of at least 50% as a result of removing silicon between one or more of the active silicon areas.

12. A method of increasing transparency of one or more micro-displays, the method comprising:
    obtaining a semiconductor wafer, the semiconductor wafer comprising:
        a substrate comprising silicon;
        a buried oxide layer coupled to the substrate; and
        a plurality of active silicon islands coupled to the buried oxide layer, and separated from each other by non-active silicon islands and oxide trenches;
    attaching a cover glass to the semiconductor wafer;
    after attaching the cover glass to the semiconductor wafer, removing the silicon substrate; and
    after attaching the cover glass to the semiconductor wafer, removing at least a portion of the non-active silicon islands and oxide trenches, wherein removing at least a portion of the non-active silicon islands and oxide trenches causes the one or more micro-displays to have a transparency of at least 50%.

13. The method of claim 12, wherein removing at least the portion of the non-active silicon islands and oxide trenches comprises removing a portion of the buried oxide layer, and using remaining buried oxide as a hard mask.

14. The method of claim 12, further comprising adding a transparent backfill material between the active silicon islands after removing the at least a portion of the non-active silicon islands and oxide trenches.

15. The method of claim 14, wherein the transparent backfill material comprises a two-part epoxy for coupling a micro-display to a fiber optic for an analog night vision system to allow light from an image intensifier to be transmitted through the micro-display.

16. The method of claim 12, wherein removing at least the portion of the non-active silicon islands and oxide trenches results in at least an 80% increase in transparency for at least one micro display.

17. A micro-display comprising:
a glass cover;
a semiconductor wafer coupled to the glass cover, the semiconductor wafer comprising:
a buried oxide layer; and
a plurality of active silicon islands coupled to the buried oxide layer, and separated from each other by space created by non-active silicon islands and oxide trenches having been removed after the glass cover was coupled to the semiconductor wafer, wherein the oxide trenches having been removed causes the micro-display to have a transparency for incoming light coming into the one or more micro-displays and through the one or more micro-displays of at least 50%.

18. The micro-display of claim 17, wherein the buried oxide layer comprises a hard mask used to remove the non-active silicon islands.

19. The micro-display of claim 17, further comprising a transparent backfill material between the active silicon islands.

20. The micro-display of claim 17, further comprising a transparent backfill material between the active silicon islands, the transparent backfill material comprising a two-part epoxy for coupling the micro-display to a fiber optic for an analog night vision system to allow light from an image intensifier to be transmitted through the micro-display.

* * * * *